(12) United States Patent
Shen

(10) Patent No.: US 8,786,082 B2
(45) Date of Patent: Jul. 22, 2014

(54) SEMICONDUCTOR STRUCTURE HAVING NO ADJACENT BUMPS BETWEEN TWO ADJACENT PADS

(71) Applicant: Chipmos Technologies Inc., Hsinchu (TW)

(72) Inventor: Geng-Shin Shen, Hsinchu (TW)

(73) Assignee: Chipmos Technologies Inc., Hsinchu (TW)

( * ) Notice: Subject to any disclaimer, the term of this patent is extended or adjusted under 35 U.S.C. 154(b) by 0 days.

(21) Appl. No.: 13/671,202

(22) Filed: Nov. 7, 2012

(65) Prior Publication Data

US 2013/0147037 A1 Jun. 13, 2013

(30) Foreign Application Priority Data

Dec. 9, 2011 (TW) .............................. 100145468 A

(51) Int. Cl.
*H01L 23/48* (2006.01)

(52) U.S. Cl.
USPC ............... 257/737; 257/E23.01; 257/E23.09; 257/E23.021; 257/E23.069; 257/E23.02; 257/E23.022; 257/738; 257/778; 257/642; 257/780; 257/741; 257/682; 257/621

(58) Field of Classification Search
USPC .......... 257/737, 738, 778, 642, E23.019, 741, 257/780, 682, 621, E23.021, E23.069, 257/E23.02, E23.022, E23.01
See application file for complete search history.

(56) References Cited

U.S. PATENT DOCUMENTS

| 7,033,923 | B2 * | 4/2006 | Seshan .......................... 438/614 |
| 7,977,789 | B2 * | 7/2011 | Park ............................... 257/737 |
| 8,030,767 | B2 * | 10/2011 | Yang .............................. 257/737 |
| 2004/0104261 | A1 * | 6/2004 | Sterrett et al. ............ 228/180.22 |
| 2006/0175686 | A1 * | 8/2006 | Murata et al. ................. 257/642 |
| 2006/0273430 | A1 * | 12/2006 | Hua et al. ...................... 257/621 |
| 2007/0284758 | A1 * | 12/2007 | Zhang et al. .................. 257/780 |
| 2012/0038047 | A1 * | 2/2012 | Do et al. ........................ 257/741 |
| 2013/0292821 | A1 * | 11/2013 | Chi ................................ 257/737 |

* cited by examiner

*Primary Examiner* — Alexander Oscar Williams
(74) *Attorney, Agent, or Firm* — Muncy, Geissler, Olds & Lowe, P.C.

(57) ABSTRACT

A semiconductor structure is provided. The semiconductor structure includes a substrate, at least two pads, a passivation layer, at least two under bump metallization (UBM) layers and at least two bumps. The pads are disposed adjacent to each other on the substrate along the first direction. The passivation layer covers the substrate and the peripheral upper surface of each pad to define an opening. Each of the openings defines an opening projection along the second direction. The opening projections are disposed adjacent to each other but not overlapping with each other. Furthermore, the first direction is perpendicular to the second direction. The UBM layers are disposed on the corresponding openings, and the bumps are respectively disposed on the corresponding UBM layers. With the above arrangements, the width of each bump of the semiconductor structure of the present invention could be widened without being limited by the bump pitch.

17 Claims, 10 Drawing Sheets

SEMICONDUCTOR STRUCTURE HAVING NO ADJACENT BUMPS BETWEEN TWO ADJACENT PADS

This application claims priority to Taiwan Patent Application No. 100145468 filed on Dec. 9, 2011, which is hereby incorporated herein by reference in its entirety.

CROSS-REFERENCES TO RELATED APPLICATIONS

Not applicable.

BACKGROUND OF THE INVENTION

1. Field of the Invention

The present invention provides a semiconductor structure, and more particularly, to a semiconductor structure in which the bump pitch is narrower than the bump width.

2. Descriptions of the Related Art

With the advancement of semiconductor packaging technologies, the conventional practice of using bonding wires for electrical connection has been replaced by the use of bumps. By disposing bumps on a chip through electroplating, solder paste transferring, evaporation or direct adhesion of soldering balls, electrical connection between the chip and substrate circuit can be accomplished. Among various bump-related packaging technologies, the Flip Chip in Package (FCiP) technology has become the mainstream technology over recent years due to the considerations of the cost and the package size.

According to FCiP technology, a chip is disposed upside down so that the bumps on the chip can be electrically connected with a circuit on the substrate directly. To increase the circuit density on individual packages, an active surface of the chip must be made to have as many bump contacts as possible, which necessitates the reduction of the bump pitch and the bump width. However, the bump pitch and the bump width can only be reduced to a limited extent, and a small bump pitch also leads to a reduced bump width. When probes are used for inspection, the small bumps make it necessary to operate the probes at a high precision, which increases the time duration, cost and difficulty of the inspection process.

FIGS. 1A and 1B illustrate the top and cross-sectional view of a conventional semiconductor structure 1. In detail, the semiconductor structure 1 comprises a substrate 10, a plurality of connection pads 12, a protection layer 14, a plurality of under bump metallization (UBM) layers 16 and a plurality of bumps 18. The connection pads 12 are disposed on the substrate 10 adjacent to each other and disposed in sequence. The connection pads 12 are electrically connected to both the UBM layers 16 and the bumps 18 via a plurality of openings 142 defined in the protection layers 14. As shown, in conventional circuit designs, the bump pitch $W_1$ must be wider than the bump width $W_2$ to prevent short-circuiting due to the contaction between the bumps. In other words, while designing the bump size, the limitation of the bump width $W_2$ (should be narrower than the bump pitch $W_1$) is considered. To reduce the overall size, the limitation of the bump width has impeded testing; for example, the positioning accuracy of the probes is limited, and bumps with an insufficient width will increase the difficulty in packaging and increase the probability of bump exfoliation.

Accordingly, it is important to provide a semiconductor structure that can overcome the aforesaid shortcomings, have a small package size and a high circuit density, and allows for easy electrical testing.

SUMMARY OF THE INVENTION

An objective of the present invention is to provide a semiconductor structure in which the bump width is not limited by the bump pitch, is easily tested by probes and is easy to package.

To achieve the aforesaid objective, the present invention provides a semiconductor structure, which comprises a substrate, at least two pads, a passivation layer, at least two under bump metallization (UBM) layers and at least two bumps. The semiconductor structure has a first direction and a second direction perpendicular to the first direction. The at least two pads are disposed on the substrate adjacent to each other along the first direction. The passivation layer is disposed on and covers the substrate and the peripheral upper surface of each of the pads to define an opening corresponding to each of the pads. The at least two UBM layers are respectively disposed on the opening of each of the pads and are electrically connected to the pads respectively. The at least two bumps are respectively disposed on the at least two UBM layers. Each of the openings defines an opening projection along the second direction, while the opening projections are disposed adjacent to each other and are not overlapping.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following description, the present invention will be explained with reference to embodiments thereof. The present invention provides a semiconductor structure. It shall be appreciated that in the following embodiments and attached drawings, the description of the embodiments is only for purpose of illustration rather than to limit the present invention. Meanwhile, in the following embodiments and the attached drawings, elements unrelated to the present invention are omitted from depiction; and dimensional relationships among the individual elements in the attached drawings are illustrated only for the ease of understanding, but not to limit the actual scale and size.

Figure 1A:
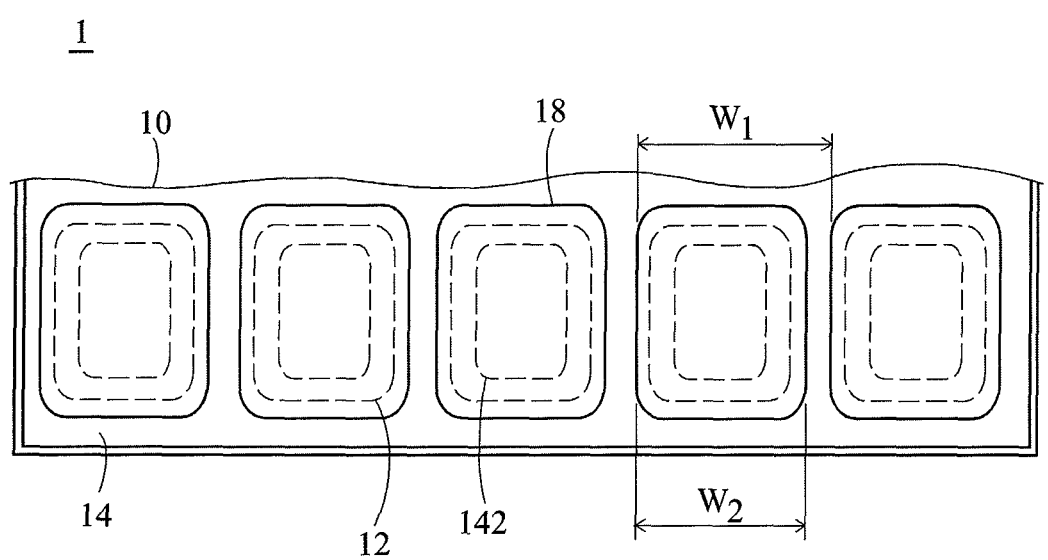
FIG. 1A is a schematic partial top view of a conventional semiconductor structure.
Figure 1B:
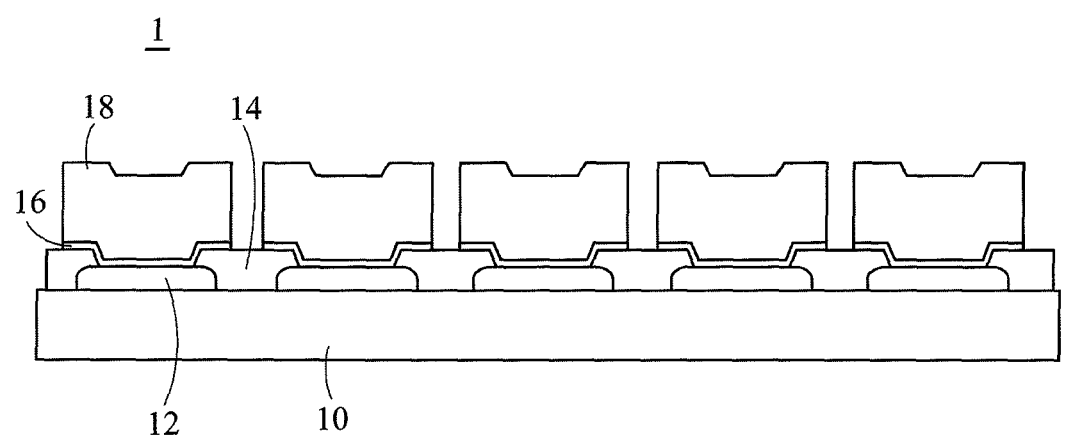
FIG. 1B is a schematic cross-sectional view of the conventional semiconductor structure shown in FIG. 1A.
Figure 2A:
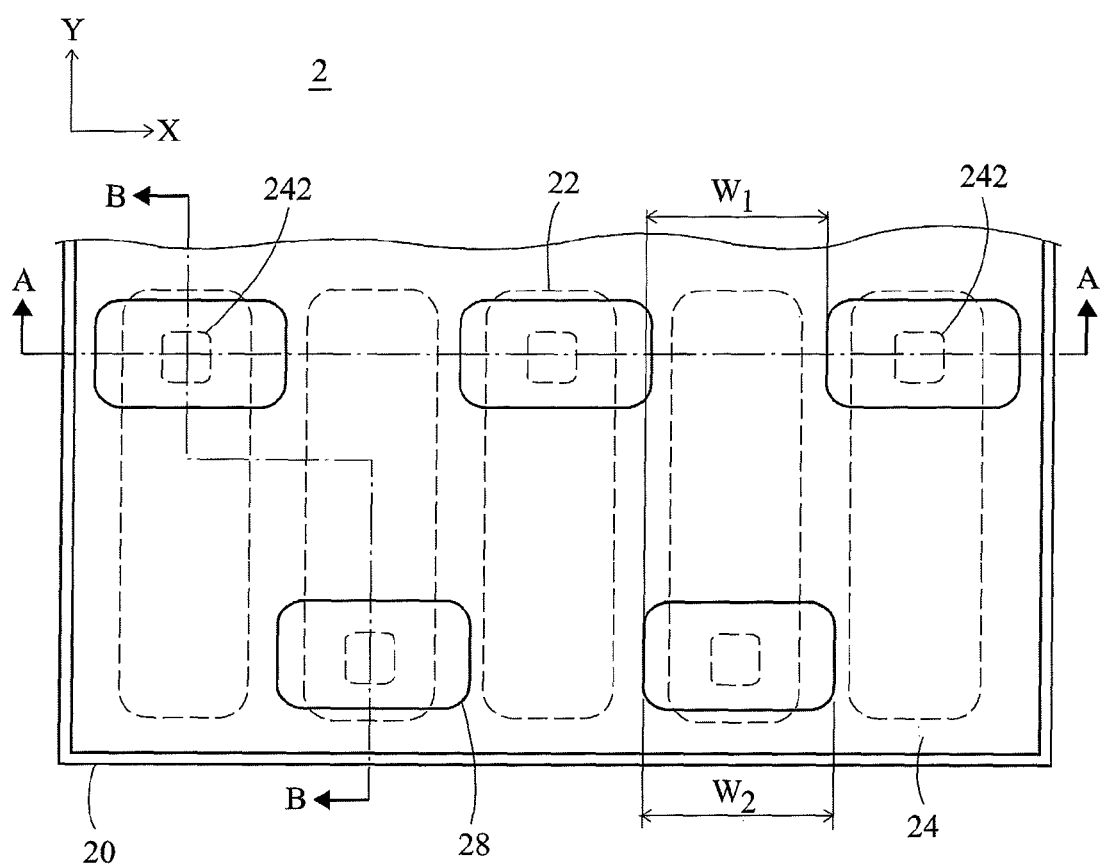
FIG. 2A is a schematic partial top view of a semiconductor structure according to the first embodiment of the present invention.
Figure 2B:
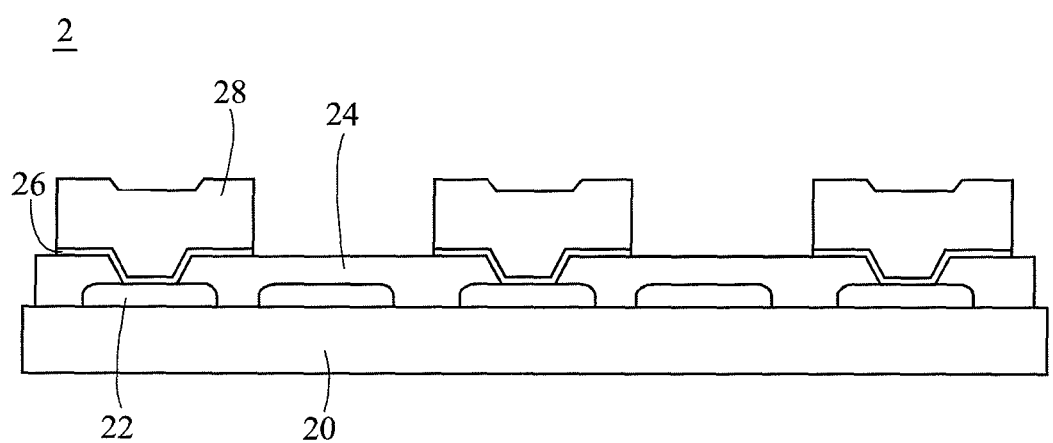
FIG. 2B is a schematic cross-sectional view of FIG. 2A taken along line A-A.
Figure 2C:
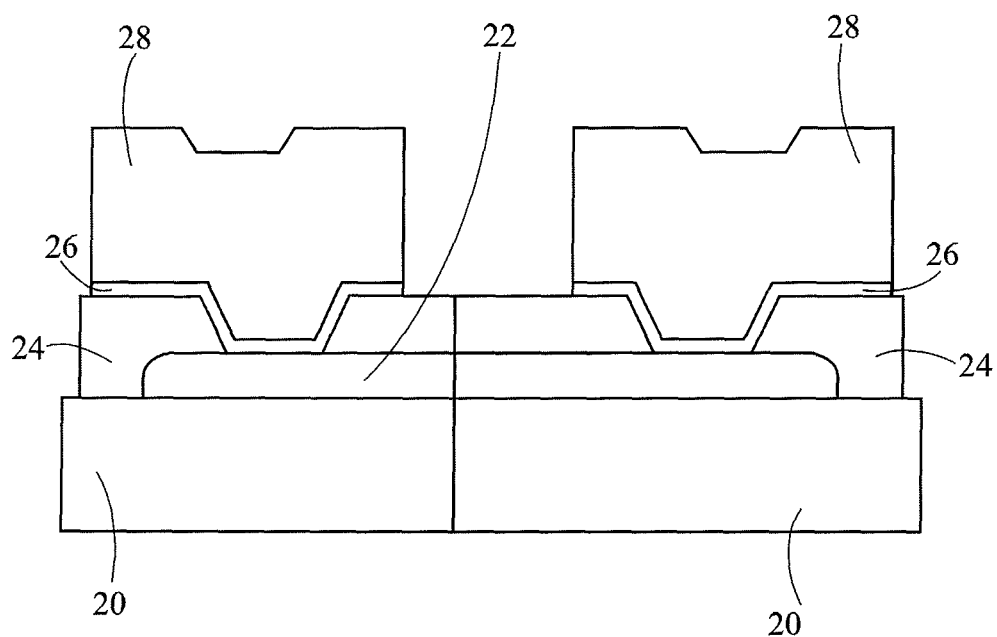
FIG. 2C is a schematic cross-sectional view of FIG. 2A taken along line B-B.

First, FIGS. 2A to 2C illustrate the first embodiment of the present invention. The semiconductor structure 2 comprises a substrate 20, a plurality of pads 22, a passivation layer 24, a plurality of Under Bump Metallization (UBM) layers 26 and a plurality of bumps 28.

As shown in FIG. 2A, the first direction X and second direction Y perpendicular to the first direction X may be defined in the semiconductor structure 2. In this embodiment, the pads 22 are each of a bar shape formed along the second direction Y and are arranged on the substrate 20 equidistantly, although the present invention is not limited thereto.

The passivation layer 24 covers the substrate 20 and the peripheral upper surface of each of the pads 22 to define an opening 242 on each of the pads 22. Each of the openings 242 has an opening projection (not shown) along the second direction Y, and the opening projections of any two adjacent openings are adjacent to but not overlapping with each other. The UBM layers 26 are disposed on the openings 242 and are electrically connected to the pads 22. The bumps 28 are disposed on the UBM layers 26. In detail, the bumps 28 may be formed on the UBM layers 26 through the printing, dispensing or electroplating of the material used for the bumps 28. It will be readily appreciated by those skilled in the art that in the above descriptions and the corresponding drawings, there may be different bump designs. Furthermore, the bumps of the present invention may also be formed as a trapezoidal form or an irregular form when being viewed from the top and each have a bump projection along the second direction Y with adjacent bump projections partially overlapping with each other. Therefore, the present invention is not merely limited to the above embodiment in which the bump projections of adjacent bumps are not overlapping each other in the second direction Y.

In this embodiment, the substrate 20 may be a chip, a wafer, a printed circuit board (PCB), a ceramic substrate or a film; the UBM layers 26 may be made of titanium (Ti), copper (Cu), vanadium (V), TiW or an alloy thereof; the bumps 28 may be made of gold (Au), silver (Ag), copper (Cu), nickel (Ni), an alloy thereof, an electrically conductive polymer, or some other equivalent metal material; and the passivation layer 24 may be made of silicon oxide ($SiO_2$) or silicon nitride (SiN).

It shall be appreciated that, the phrase "each of the openings 242 has an opening projection along the second direction Y", means that the projections of any two adjacent openings defined by the passivation layer can form two projection line segments along the second direction that are adjacent to but not overlapping each other; and the term "adjacent" used in "adjacent bumps" and "adjacent openings" refers to the bumps disposed on the openings of the adjacent pads.

Further, FIG. 2B illustrates a schematic cross-sectional view of FIG. 2A taken along line A-A. As shown, each of the bumps 28 may have an increased or designed width that is wider than the conventional bump, and the width of each of the bumps 28 may be increased along the first direction X. In some embodiments, given the same pad pitch, the surface area of each of the bumps 28 may be increased to about twice that of the conventional bump.

FIG. 2C illustrates a schematic cross-sectional view of FIG. 2A taken along line B-B. As shown, it is unnecessary for each of the bumps 28 to have a bilaterally symmetrical width with respect to the center of the opening 242; instead, if allowed, the bump 28 could be elongated at one side to enhance the stability of the packaging process (e.g., the inner pin bonding process) and the probing process. That is, as shown in FIG. 2C, one side of each of the bumps 28 extends out longer than the other side.

According to the above descriptions, in the semiconductor structure according to the first embodiment of the present invention as shown in FIG. 2B, any two adjacent bumps define a bump pitch $W_1$ (i.e., a pitch defining the corresponding side edges along the second direction Y of the adjacent bumps). The bump pitch $W_1$ is substantially narrower than the bump width $W_2$. Therefore, the bumps of the present invention have a greater surface area for electrical connection than conventional bumps. The greater surface area is favorable for the electrical testing of both the chip and between the bumps, and satisfies the developmental trend of minimizing package volume and increasing circuit density.

Figure 3A:
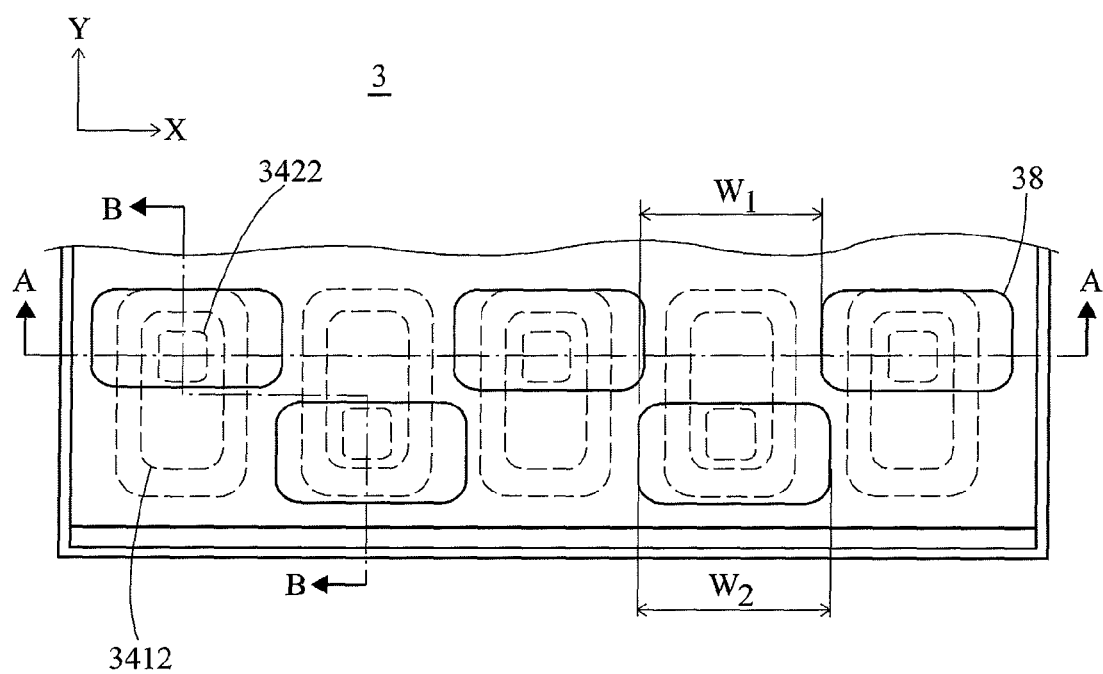
FIG. 3A is a schematic partial top view of a semiconductor structure according to the second embodiment of the present invention.
Figure 3B:
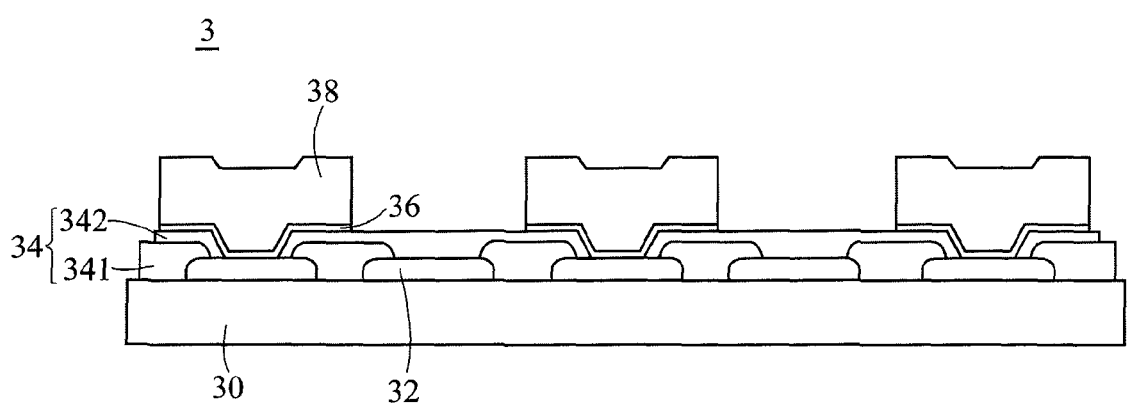
FIG. 3B is a schematic cross-sectional view of FIG. 3A taken along line A-A.
Figure 3C:
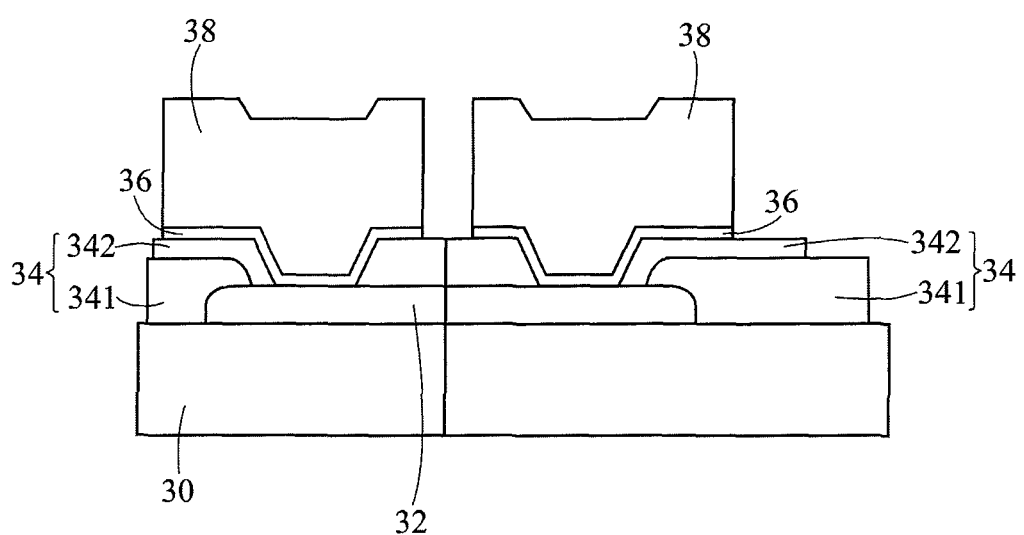
FIG. 3C is a schematic cross-sectional view of FIG. 3A taken along line B-B.

FIGS. 3A to 3C are schematic views of a semiconductor structure 3 according to the second embodiment of the present invention. Similar to the first embodiment, the semiconductor structure 3 also comprises a substrate 30, a plurality of pads 32, a passivation layer 34, a plurality of UBM layers 36 and a plurality of bumps 38.

The main difference between the two embodiments is that in this embodiment the passivation layer 34 further comprises a protection layer 341 and an insulation layer 342. The protection layer 341 covers the substrate 30 and the peripheral upper surface of each of the pads 32 to define a pad opening 3412 on each of the pads 32. Then, the insulation layer 342 covers the protection layer 341 and partially covers the pad openings 3412 to define the openings 3422 respectively. The pad openings 3412 each have a pad opening projection (not shown) along the second direction Y, while the pad opening projections overlap with each other. In the present invention, the insulation layer may be made of an elastic material so that apart from providing an insulation function, it can further absorb stressors applied to the bumps during the bonding process to prevent undercutting of the bumps.

Similarly, as shown in FIG. 3C, there is a schematic cross-sectional view of FIG. 3A taken along line B-B. As compared to the conventional bumps, the bumps 38 of this embodiment each have a wider surface, and the width of each of the bumps 38 along the first direction X may be further increased to enhance convenience during testing. In some embodiments, given the same pad pitch, the surface area of each of the bumps 28 may be increased to about twice that of the conventional bump.

Other arrangements of components, relationships among the individual components, and materials used in this embodiment are all similar to those of the first embodiment, so no description will be repeated thereon again.

In the second embodiment, the bump pitch $W_1$ is also substantially narrower than the bump width $W_2$. Therefore, the bumps of the present invention have a greater surface area for electrical connection than conventional bumps. A greater surface area is favorable for the electrical testing of both the chip and the connection between the bumps, and satisfies the developmental trend of shrinking the package volume, while increasing the circuit density.

Figure 4:
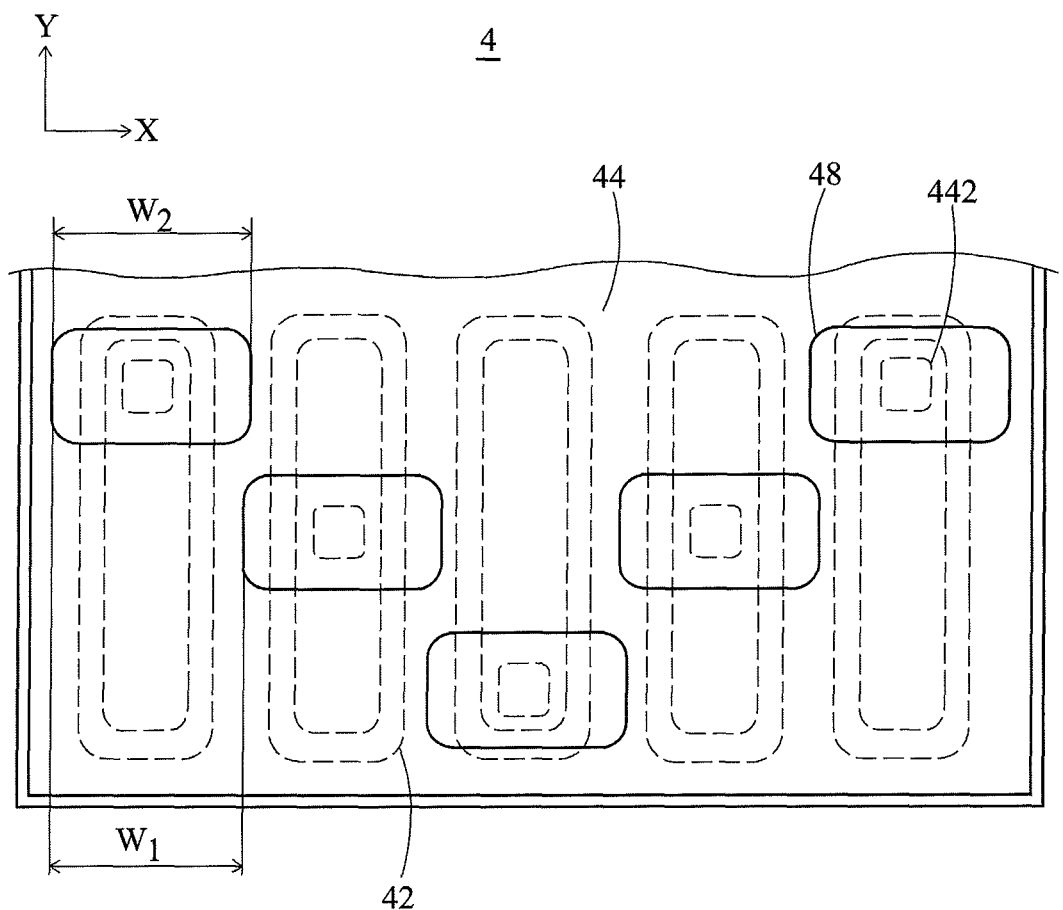
FIG. 4 is a schematic partial top view of a semiconductor structure according to the third embodiment of the present invention.
Figure 5:
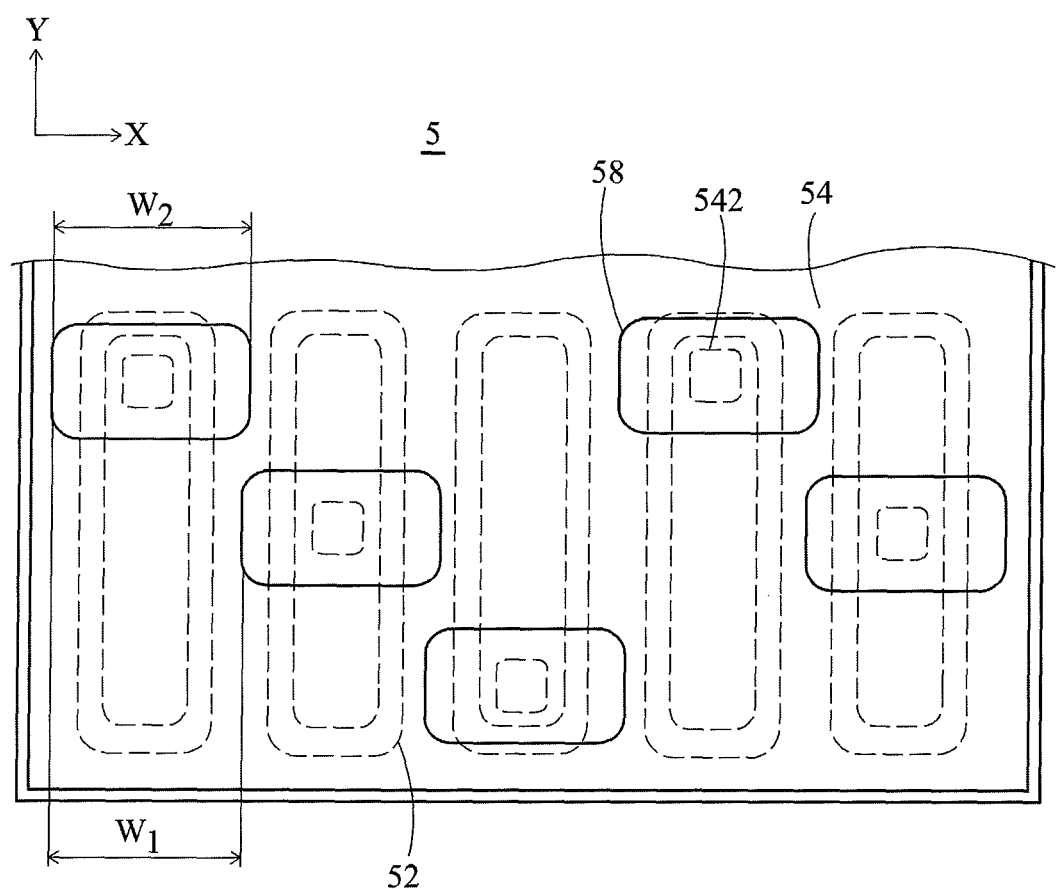
FIG. 5 is a schematic partial top view of a semiconductor structure according to the fourth embodiment of the present invention.

In addition to the aforesaid two embodiments, the semiconductor structure may also be arranged in other ways so that, with different opening positions, problems with conventional bumps can be prevented and the objective of the present invention can still be achieved. FIGS. 4 and 5, show the schematic views of the third embodiment and fourth embodiment of the present invention respectively. The semiconductor structure 4 also comprises a substrate (not labeled), a plurality of pads 42, a passivation layer 44, a plurality of UBM layers (not shown) and a plurality of bumps 48; and the semiconductor structure 5 also comprises a substrate (not labeled), a plurality of pads 52, a passivation layer 54, a plurality of UBM layers (not shown) and a plurality of bumps 58. In these two embodiments, the openings 442 (or openings 542) of any two adjacent pads 42 (or pads 52) are disposed adjacent to each other along the second direction Y but are not overlapping with each other, so these two embodiments can also achieve similar effect and realize the same objective as the previous embodiments.

It shall be appreciated that the partial top views of the semiconductor structures depicted herein are only intended to illustrate the partial arrangements of the semiconductor structures, so the present invention is not limited to the descriptions thereof. The user may also apply the present invention in different designs without departing from the concept of the present invention. Accordingly, a semiconductor structure may wholly or partially adopt the concept of the present invention.

According to the above descriptions, by disposing the openings on the pads in a staggered way, the width of each pad will no longer be limited by the bump pitch. Thereby, the accuracy of probing and the package yield can be improved.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A semiconductor structure, having a first direction and a second direction, the second direction being perpendicular to the first direction, and the semiconductor structure comprising:
    a substrate;
    at least two pads, being disposed on the substrate adjacent to each other along the first direction;
    a passivation layer, being disposed on and covering the substrate and a peripheral upper surface of each of the pads and defining an opening corresponding to each of the pads;
    at least two UBM layers, being respectively disposed on the opening of each of the pads; and
    at least two bumps, being respectively disposed on the at least two UBM layers,
    wherein, each of the openings defines an opening projection along the second direction at a projection plane, and the two opening projections defined by any two of the adjacent openings are not overlapped with each other.

2. The semiconductor structure as claimed in claim 1, wherein the passivation layer further comprises a protection layer that covers the substrate and the peripheral upper surface of each of the pads to define a pad opening on each of the pads, wherein each of the pad openings defines an pad opening projection along the second direction and the pad opening projections overlap with each other.

3. The semiconductor structure as claimed in claim 2, wherein the passivation layer further comprises an insulation layer that covers the protection layer and partially covers each of the pad openings to define the opening corresponding to each of the pads.

4. The semiconductor structure as claimed in claim 1, wherein the at least two bumps are made of Au, Ag, Cu, Ni or an alloy thereof.

5. The semiconductor structure as claimed in claim 1, wherein the at least two bumps define at least two bump projections along the second direction, and any two of the at least two bump projections partially overlap with each other.

6. The semiconductor structure as claimed in claim 1, wherein the at least two UBM layers are made of Ti, Cu, Vanadium, TiW or an alloy thereof.

7. The semiconductor structure as claimed in claim 1, wherein the at least two bumps are made of an electrically conductive polymer.

8. The semiconductor structure as claimed in claim 1, wherein the substrate is a chip.

9. The semiconductor structure as claimed in claim 1, wherein the substrate is a wafer.

10. The semiconductor structure as claimed in claim 1, wherein the substrate is a printed circuit board (PCB).

11. The semiconductor structure as claimed in claim 1, wherein the substrate is a film.

12. The semiconductor structure as claimed in claim 1, wherein the passivation layer is made of SiO2 or SiN.

13. The semiconductor structure as claimed in claim 1, the at least two pads are in a bar shape and disposed along the second direction.

14. The semiconductor structure as claimed in claim 1, wherein the at least two bumps are electroplated on each of the at least two UBM layers respectively.

15. The semiconductor structure as claimed in claim 1, wherein the at least two bumps define a bump pitch which is narrower than a width of any one of the at least two bumps.

16. The semiconductor structure as claimed in claim 2, wherein the at least two bumps define a bump pitch which is narrower than a width of any one of the at least two bumps.

17. The semiconductor structure as claimed in claim 3, wherein the at least two bumps define a bump pitch which is narrower than a width of any one of the at least two bumps.

* * * * *